US010214806B2

(12) United States Patent
Readinger et al.

(10) Patent No.: US 10,214,806 B2
(45) Date of Patent: Feb. 26, 2019

(54) BELLOWS-FREE RETRACTABLE VACUUM DEPOSITION SOURCES

(71) Applicant: Veeco Instruments Inc., Plainview, NY (US)

(72) Inventors: Eric Daniel Readinger, Wyoming, MN (US); Rikki Scott LaBere, Maplewood, MN (US); Richard Charles Bresnahan, Denmark Township, MN (US); Scott Wayne Priddy, Saint Louis Park, MN (US)

(73) Assignee: VEECO INSTRUMENTS INC., Plainview, NY (US)

( * ) Notice: Subject to any disclaimer, the term of this patent is extended or adjusted under 35 U.S.C. 154(b) by 800 days.

(21) Appl. No.: 14/314,995

(22) Filed: Jun. 25, 2014

(65) Prior Publication Data

US 2014/0373785 A1    Dec. 25, 2014

Related U.S. Application Data

(60) Provisional application No. 61/839,231, filed on Jun. 25, 2013.

(51) Int. Cl.
*C23C 14/24*    (2006.01)
*C23C 14/56*    (2006.01)
*H01L 51/00*    (2006.01)

(52) U.S. Cl.
CPC ............ *C23C 14/56* (2013.01); *C23C 14/246* (2013.01); *H01L 51/001* (2013.01)

(58) Field of Classification Search
CPC ..... C23C 14/24–14/325; Y10T 24/2158; B25J 9/1045
See application file for complete search history.

(56) References Cited

U.S. PATENT DOCUMENTS 1,886,663 A  *  11/1932  Field ....................... B23P 17/06
                                                    29/4.53
3,671,133 A  *   6/1972  Galbarini ............. B23Q 11/001
                                                    408/235
(Continued)

FOREIGN PATENT DOCUMENTS

JP         2007070690 A      3/2007
JP         2008101236 A      5/2008

OTHER PUBLICATIONS

European Search Report for EP14816784.4 dated Feb. 7, 2017, 6 pages.

*Primary Examiner* — Aiden Lee
(74) *Attorney, Agent, or Firm* — Kagan Binder, PLLC

(57) ABSTRACT

Systems are provided that include one or more retractable deposition source assemblies that eliminate the need for a bellows, but do not require breaking the ultra-high vacuum of a growth module for source replacement or recharging with deposition material. Systems of the present invention may include source heads that allow for a differential pumping option that provides marked improvement in base pressure around the source head (and material) that provides longer lifetimes for sources in corrosive, reactive or oxidizing environments. In addition, systems of the invention do not require an entire growth module to be vented to refill or repair an effusion source. Instead, for maintenance events that are tied to a specific source, a retractable source assembly of the present invention allows the sources to be withdrawn from the system, isolated from the growth environment, and removed without venting the entire chamber of the growth module.

13 Claims, 18 Drawing Sheets

(56) References Cited

U.S. PATENT DOCUMENTS

| | | | |
|---|---|---|---|
| 4,309,961 A * | 1/1982 | Satoh | C30B 25/08 |
| | | | 118/733 |
| 4,607,152 A | 8/1986 | Allovon et al. | |
| 4,676,884 A * | 6/1987 | Dimock | C23C 14/566 |
| | | | 118/50 |
| 5,329,095 A * | 7/1994 | Okase | C23C 16/46 |
| | | | 118/724 |
| 5,540,780 A * | 7/1996 | Haas | C23C 14/243 |
| | | | 117/201 |
| 2004/0124080 A1 | 7/2004 | Murakami et al. | |
| 2005/0005846 A1* | 1/2005 | Selvamanickam | C23C 14/087 |
| | | | 118/718 |
| 2009/0114529 A1 | 5/2009 | Dekempeneer et al. | |
| 2009/0293810 A1* | 12/2009 | Bangert | C23C 14/243 |
| | | | 118/726 |
| 2010/0159132 A1 | 6/2010 | Conroy et al. | |

* cited by examiner

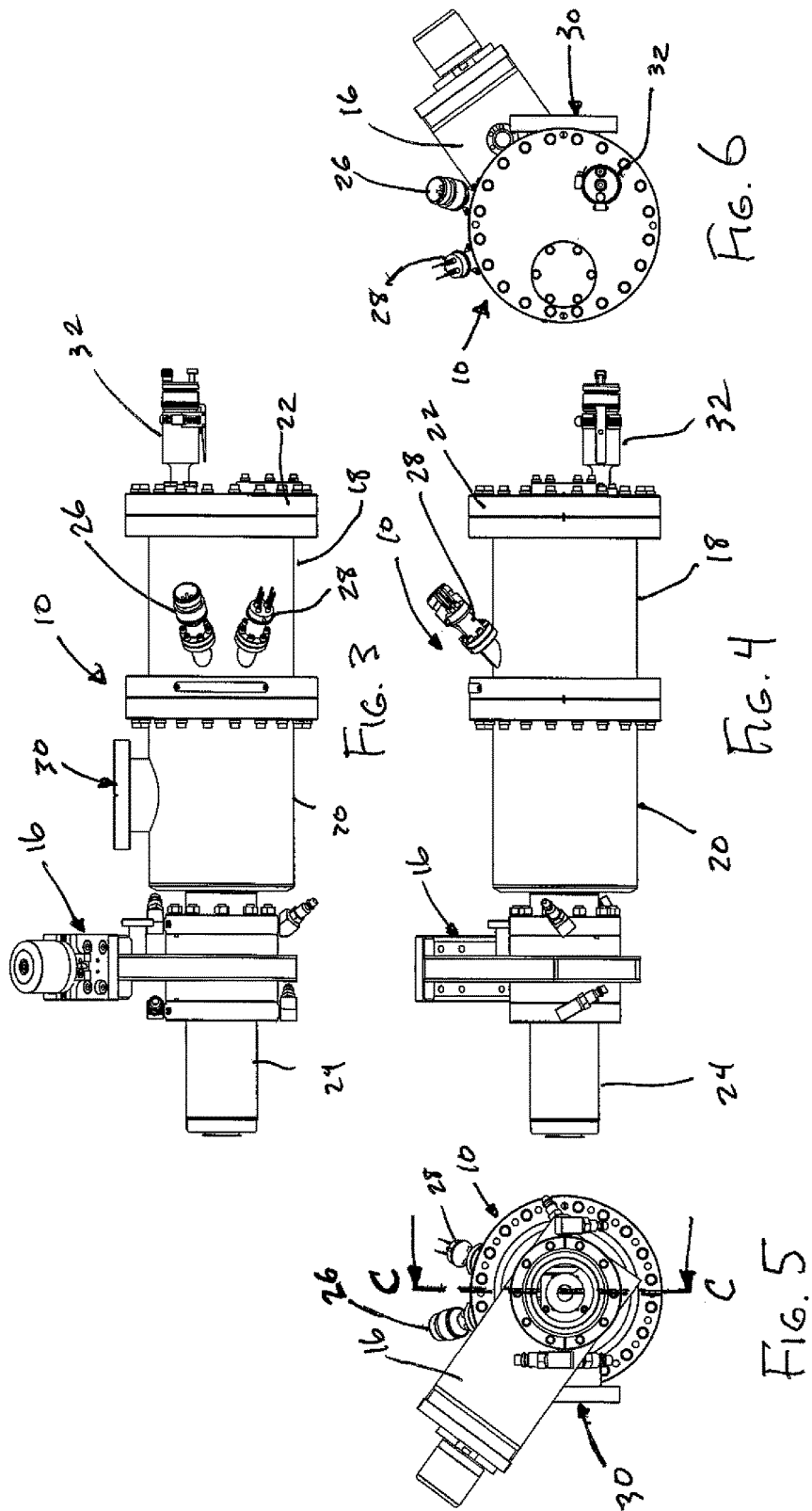

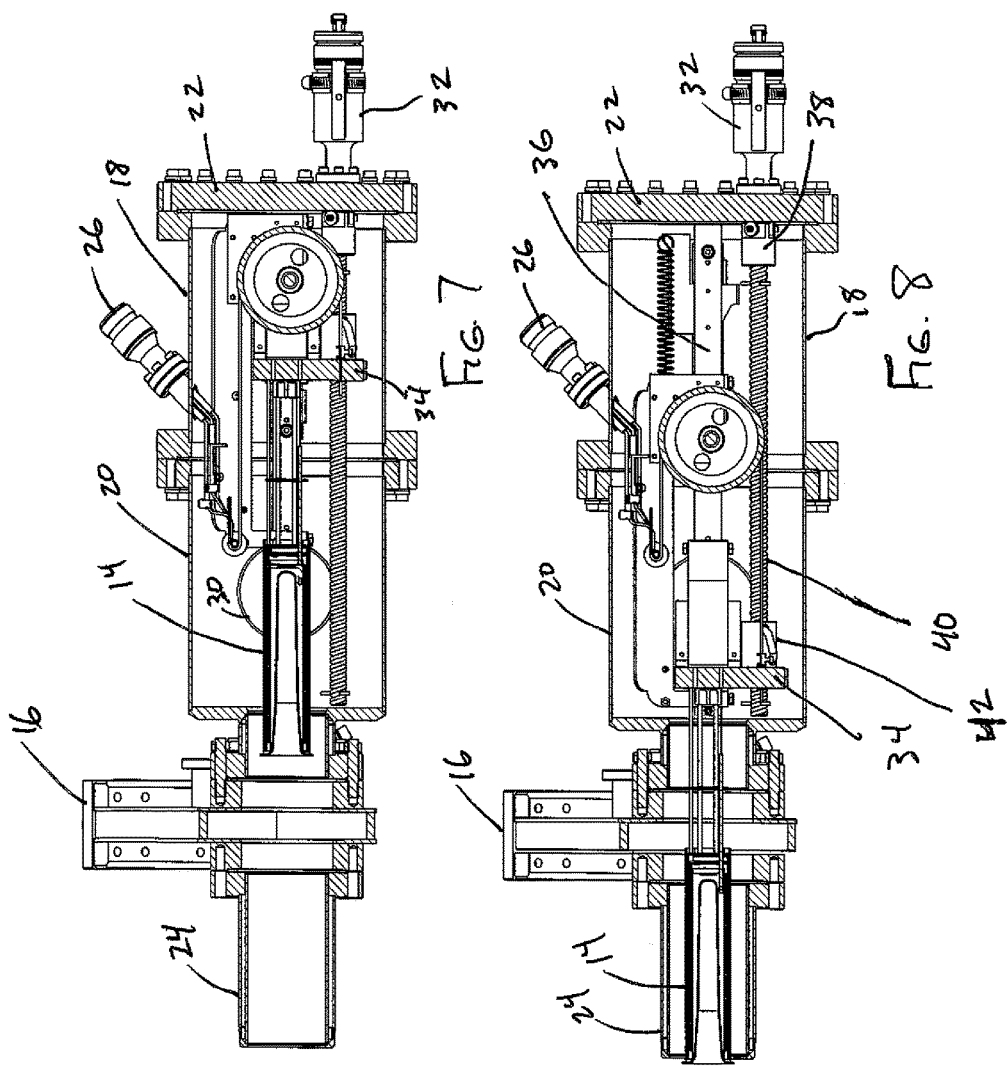

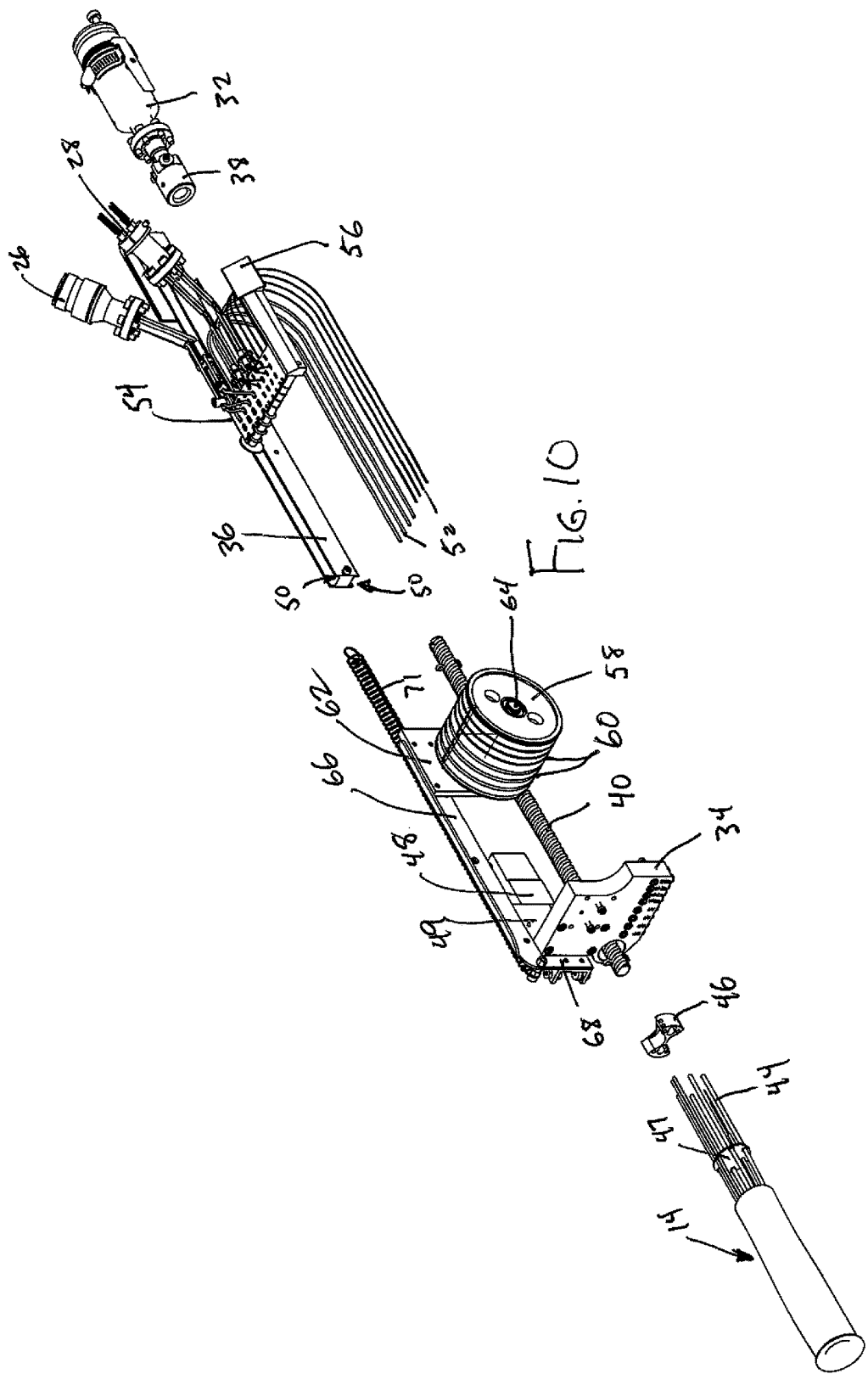

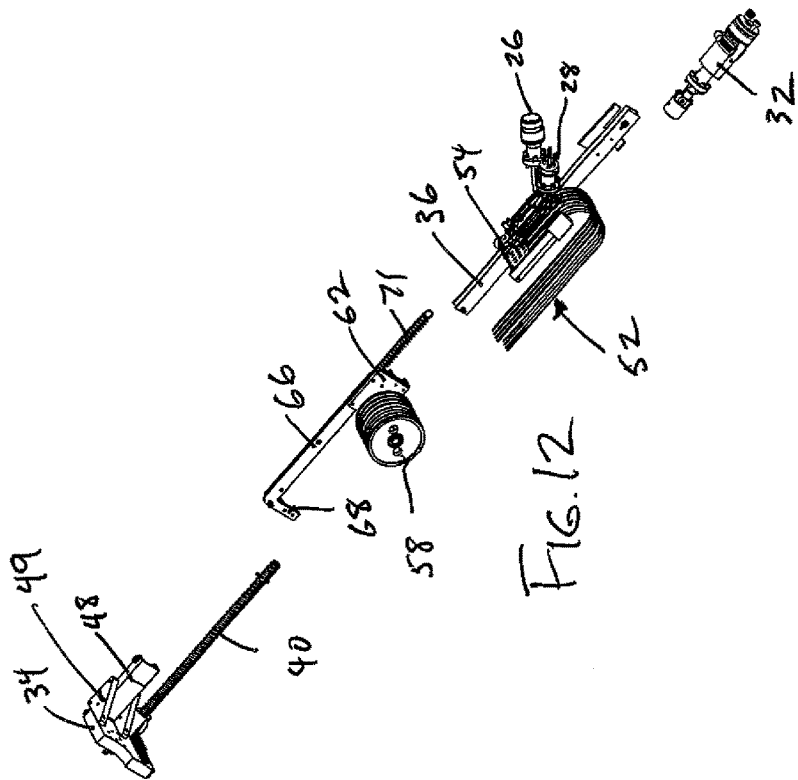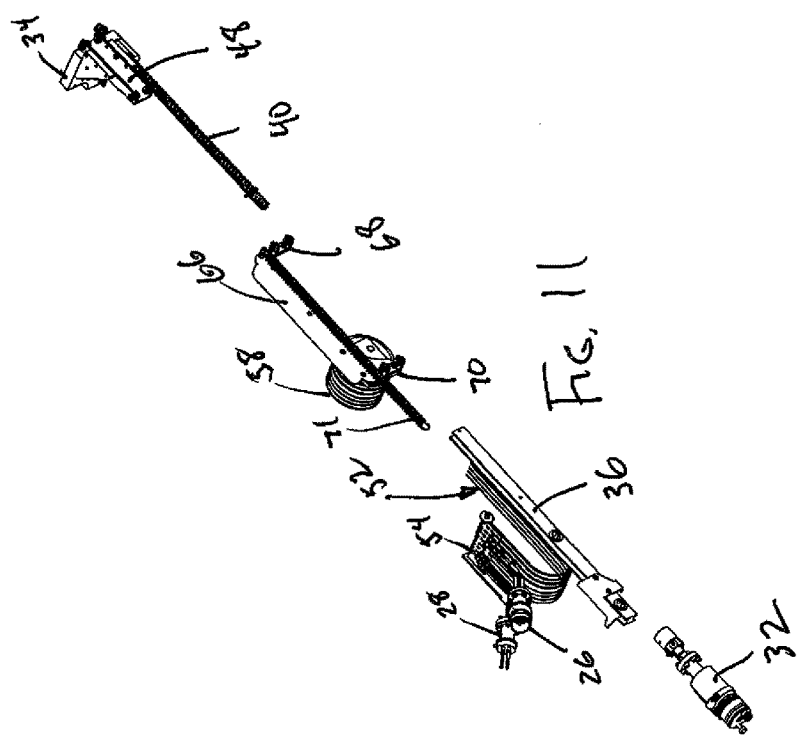

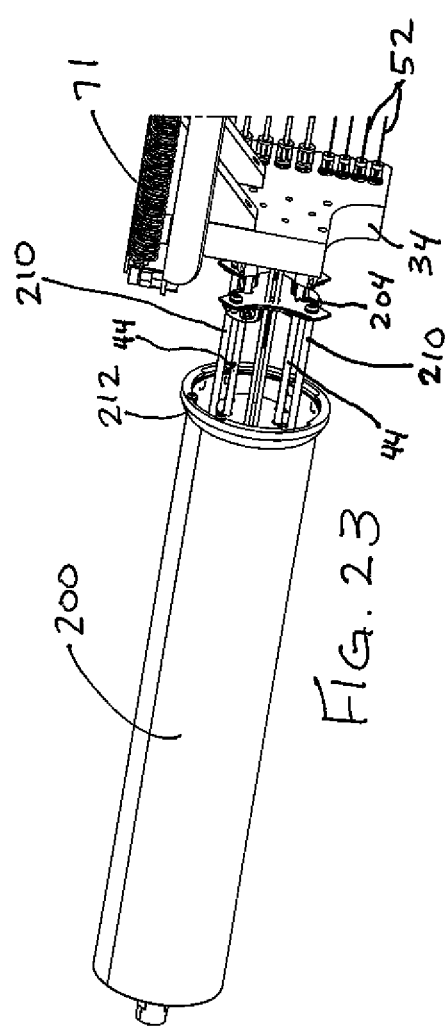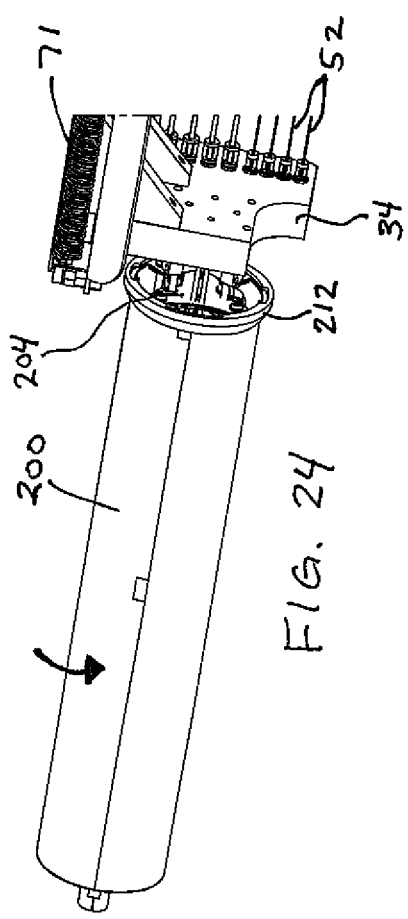

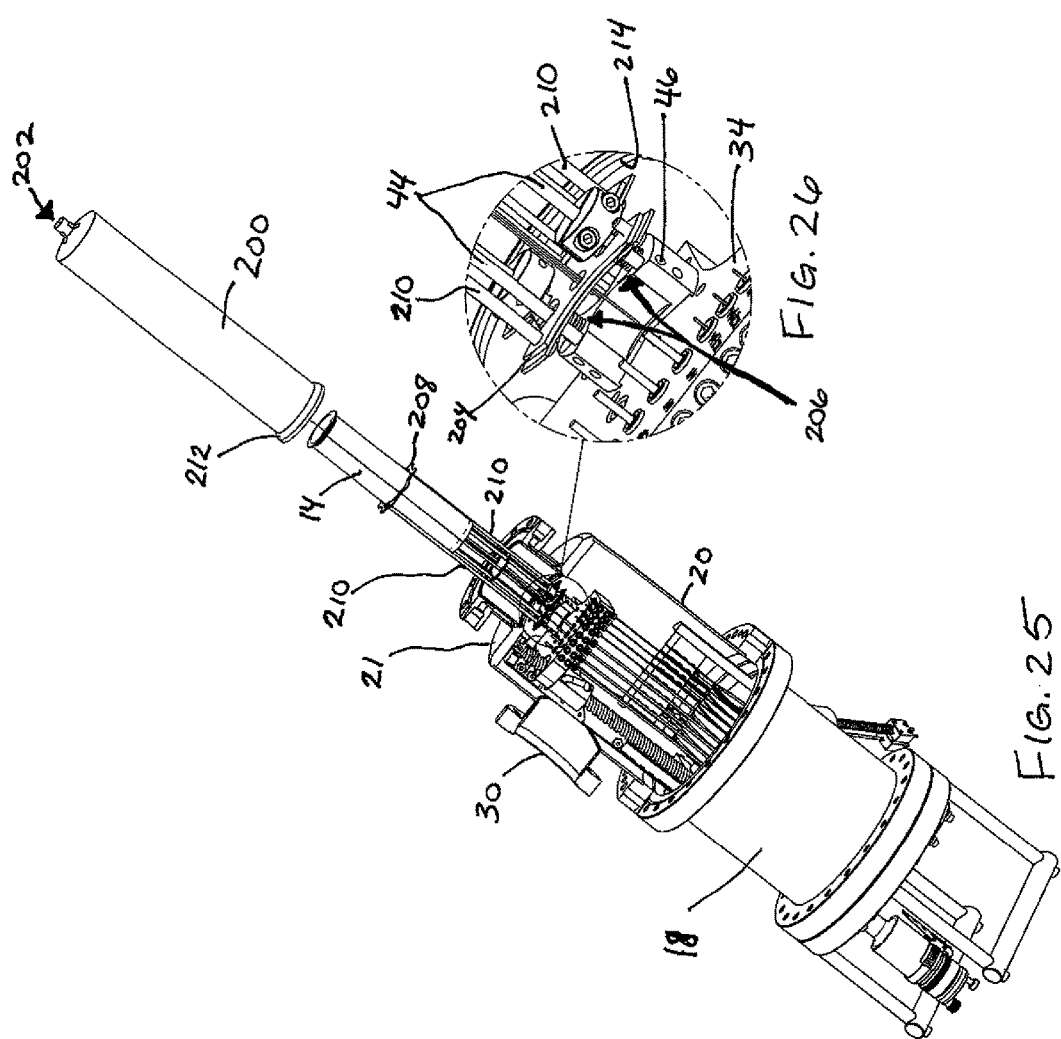

BELLOWS-FREE RETRACTABLE VACUUM DEPOSITION SOURCES

CROSS-REFERENCE TO RELATED APPLICATIONS

This application claims priority to U.S. Provisional Patent Application No. 61/839,231, filed Jun. 25, 2013 the entire contents of which are incorporated herein by reference in its entirety.

TECHNICAL FIELD

The deposition sources, systems, and methods described herein relate generally to deposition sources, systems, and methods for providing a flux of material vapor for deposition on a substrate. In particular, the deposition sources, systems, and methods described herein provide for a retractable and/or differentially pumped deposition source.

BACKGROUND

A vacuum evaporation installation, which is used in the production of semiconductors by molecular beam epitaxy, for example, generally comprises a main enclosure or growth module connected to pumping means (primary and secondary pumps) and containing the substrates to be treated, as well as one or more effusion sources containing the material or materials to be evaporated. These control modules and sources are maintained at ultra-high vacuum during deposition processes, which vacuum pumping takes a significant period of time to accomplish.

Effusion sources are typically removable and exchangeable for changing deposition processes and also for refilling or recharging purposes. A source typically includes a crucible with a select compound, referred to as an evaporation cell, which is heated to cause the compound to evaporate from the evaporation cell for deposition to a substrate. In order to permit the recharging of these sources with various materials and without breaking the ultra-high vacuum of the growth module, installations have been developed in which the evaporation cell to be recharged is detachable and is connected to the main enclosure by a metal bellows. When the bellows is compressed, the cell is in the normal evaporation position in the growth module, and then when the bellows is stretched or extended, the cell is retracted out of the growth module into a small auxiliary chamber. This chamber can be separated from the growth module by the action of a ultra-high vacuum valve. Such an installation makes it possible to recharge the cell while only placing the auxiliary chamber under atmosphere again and without breaking the vacuum of the growth module.

Although satisfactory from certain respects, such installations suffer from disadvantages due to the very significant travel which has to be given to the bellows (typically more than 500 mm), which can lead to high costs, due both to the cost of the bellows and that of the guidance and translation system, which must be very accurate to ensure a correct alignment over a considerable distance, along with a risk of pollution of the enclosure by the effect of degassing operations of the long bellows. The bellows are made of thin metal convolutions that can be damaged by physical contact during normal use. In addition, when the sources are mounted in an upward looking direction, debris (e.g., particles/flakes) can drop down onto the source, which can damage the bellows. Both issues can lead to expensive and time-consuming bellows replacement. Also, a bellows support system must overcome the force created by the difference in pressure between the vacuum inside the chamber and the atmospheric pressure outside the chamber. A pressure of approximately 14.7 psi is applied to every square inch of a bellows when the vacuum system is pumped down. For a 2 inch diameter deposition source the bellows effective area needs to be approximately 5.0 square inches. Multiply that by the 14.7 pounds per square inch of atmospheric pressure and a force of 73.5 pounds needs to be applied to hold the bellows system from moving. This constant force needs to be overcome by any support system of a metal bellows containing apparatus. This disadvantage is eliminated by the present invention. Installations that include a bellows also typically have large overall dimensions, which is prejudicial to access to the other evaporation sources. Thus, there is a need to provide deposition sources, systems, and methods that include retractable sources that overcome fundamental limitations and drawbacks of presently available systems.

SUMMARY

Deposition sources, systems, and methods described herein can efficiently and controllably provide vaporized material for deposition of thin-film materials.

In an exemplary aspect of the invention, a device is provided for moving a vacuum deposition source from a first position to a second position, the device comprising: an enclosure having an inside surface; a rail attached to the inside surface of the enclosure; a carriage positioned on the rail and movable along the rail between the first and second positions as driven by a driving device, the carriage comprising a source base plate for a vacuum deposition source; the carriage comprising a first contact that can be connected to a vacuum deposition source positioned on the source base plate; a second contact fixed relative to the enclosure and that can be connected to a power and/or thermocouple feedthrough of the enclosure; an electrical cable connected to the first contact at a first end and connected to the second contact at a second end, the electrical cable comprising predetermined slack between the first and second ends when the device is in the first position; and a cable management device configured to take up the slack in the electrical cable as the carriage moves from the first position toward the second position.

In another exemplary aspect of the invention, a device is provided for moving a vacuum deposition source from a first position to a second position, the device comprising: an enclosure having an inside surface; a rail attached to the inside surface of the enclosure; a carriage positioned on the rail and movable along the rail between the first and second positions as driven by a driving device, the carriage comprising a source base plate for a vacuum deposition source; the carriage comprising a first contact that can be connected to a vacuum deposition source positioned on the source base plate; a second contact fixed relative to the enclosure and that can be connected to a power and/or thermocouple feedthrough of the enclosure; an electrical cable connected to the first contact at a first end and connected to the second contact at a second end, wherein the first and second ends are spaced at a first distance from each other when the device is in the first position, wherein the first and second ends are spaced at a second distance from each other when the device is in the second position, and wherein the first distance is greater then the second distance; and a pulley rotatably attached to also move along the rail, the pulley positioned so the electrical cable at least partially wraps around the pulley as the carriage moves from the first position toward the second position.

In yet another exemplary aspect of the invention, a device is provided for moving a vacuum deposition source from a first position to a second position, the device comprising: an enclosure having an inside surface; a rail attached to the inside surface of the enclosure; a carriage positioned on the rail and movable along the rail between the first and second positions as driven by a driving device, the carriage comprising a source base plate for a vacuum deposition source; the carriage comprising a first contact that can be connected to a vacuum deposition source positioned on the source base plate; a second contact fixed relative to the enclosure and that can be connected to a power and/or thermocouple feedthrough of the enclosure; and an electrical cable connected to the first contact at a first end and connected to the second contact at a second end, wherein the electrical cable is reconfigurable when the device is moved between the first and second positions.

BRIEF DESCRIPTION OF THE DRAWINGS

FIG. 3 is top side view of a retractable source assembly of the present invention showing a split housing assembly, a gate valve and power and thermocouple feedthroughs;

FIG. 4 is a similar view as FIG. 3, but from a different side position;

FIG. 5 is a front end view of the retractable source assembly of FIGS. 3 and 4;

FIG. 6 is a back end view of the retractable source assembly of FIGS. 3 and 4;

FIG. 7 is a cross-sectional view of the retractable source assembly of FIGS. 3-6 with the source retracted;

FIG. 8 is a similar cross-sectional view as FIG. 7, but with the source extended to an operative effusion position;

FIG. 10 is a partially exploded perspective view of the components of FIG. 9;

FIG. 11 is another partially exploded perspective view of the components of FIG. 9;

FIG. 12 is yet another partially exploded view from a reverse perspective as FIG. 11;

FIG. 23 is perspective view of a differential pumping sleeve of the present invention as provided to a retractable source assembly so that the differential pumping sleeve extends and retracts along with a source of the retractable source assembly, and illustrating the step of moving such a sleeve over the source;

FIG. 24 is a view similar to FIG. 23 but with the sleeve moved in position over the source and with a further act of rotating the sleeve to lock with the source assembly of the retractable source assembly;

FIG. 25 is a perspective view of a differential pumping sleeve in a positioned exploded from a retractable source assembly showing features of the connectivity of the sleeve with the retractable source assembly;

FIG. 26 is an enlarged view of the area within the circle of FIG. 25 showing a lock plate being connected with a source base plate by way of compression springs.

DETAILED DESCRIPTION

Figure 1B:
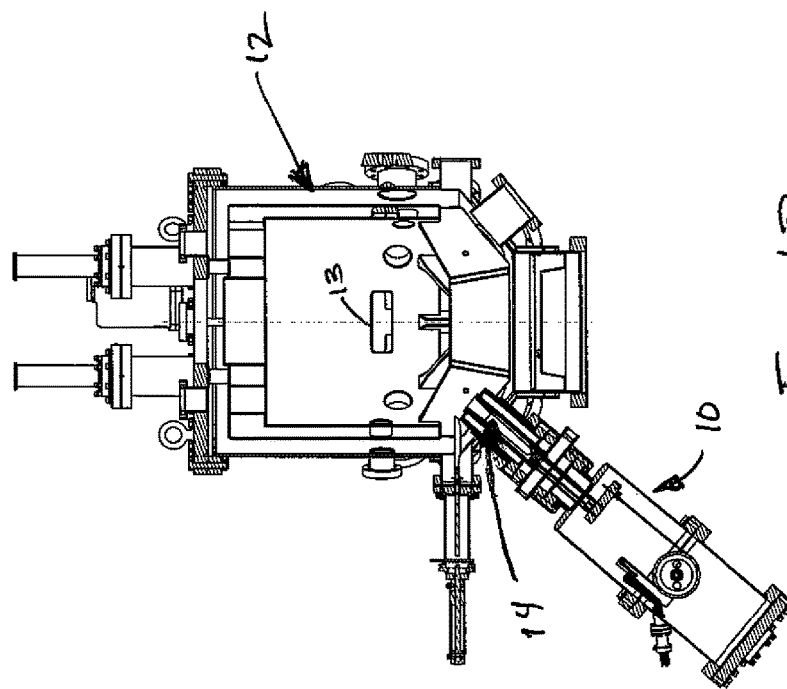
FIG. 1B is a cross-sectional view taken along line A-A of FIG. 1A.

The exemplary embodiments of the present invention described herein are not intended to be exhaustive or to limit the present invention to the precise forms disclosed in the following detailed description. Rather, the exemplary embodiments described herein are chosen and described so those skilled in the art can appreciate and understand the principles and practices of the present invention.

In accordance with the invention, systems are provided that include one or more retractable deposition source assemblies 10 that eliminate the need for a bellows, but do not require breaking the ultra-high vacuum of a growth module 12 for source replacement or recharging with deposition material. Systems of the present invention may include source heads that allow for a differential pumping option that provides marked improvement in base pressure around the source head (and deposition material) that provides longer lifetimes for sources in reactive or oxidizing environments. In addition, systems of the invention do not require an entire growth module 12 to be vented to refill or repair an effusion source 14. Instead, for maintenance events that are tied to a specific source, a retractable source assembly 10 of the present invention allows the sources 14 to be withdrawn from the system, isolated from the growth environment, and removed without venting the entire chamber of the growth module 12. The source 14 can then be removed or repaired, remounted to the growth module 12, and evacuated, thereby shortening downtime for the reactor. With these systems, the retractable source assembly 10 does not require the use of a bellows, which can further improve reliability, and the addition of differential pumping, discussed below, provides protection of the source 14 and its costly material from corrosive and/or oxidizing environments. In general, the retractable source assemblies 10 of the invention provide the following advantages: the source 14 can be isolated and removed without venting the growth module 12, refill and maintenance times are reduced, source material quality is preserved with optional differential pumping, a bellows is not required for motion, thermal control can be maintained with cooling jacket and gate valve cooling, and standard source heads can be used.

Figure 1A:
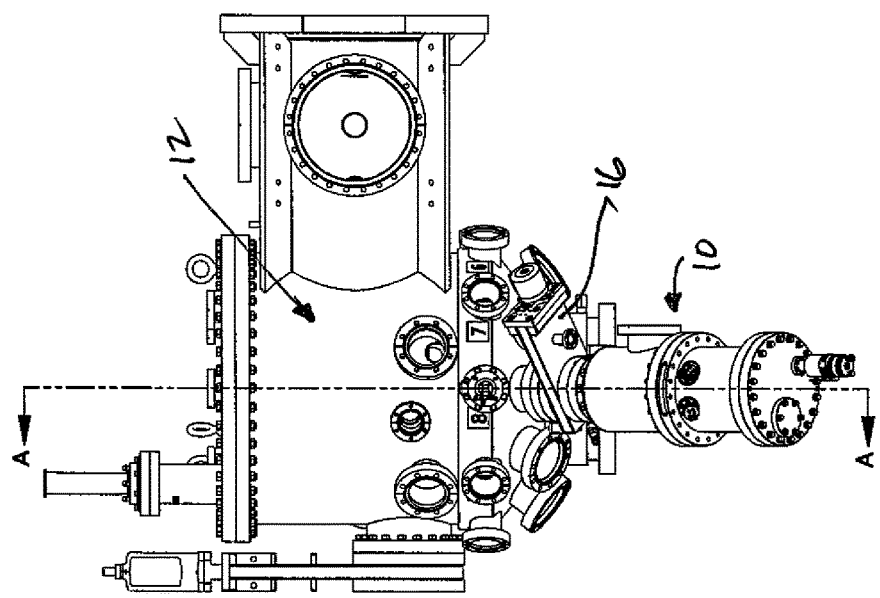
FIG. 1A is side view of a system of the present invention including an effusion growth module with a single retractable and extendible effusion source assembly of the present invention connected through a mounting port of the growth module and with the source extended.
Figure 2B:
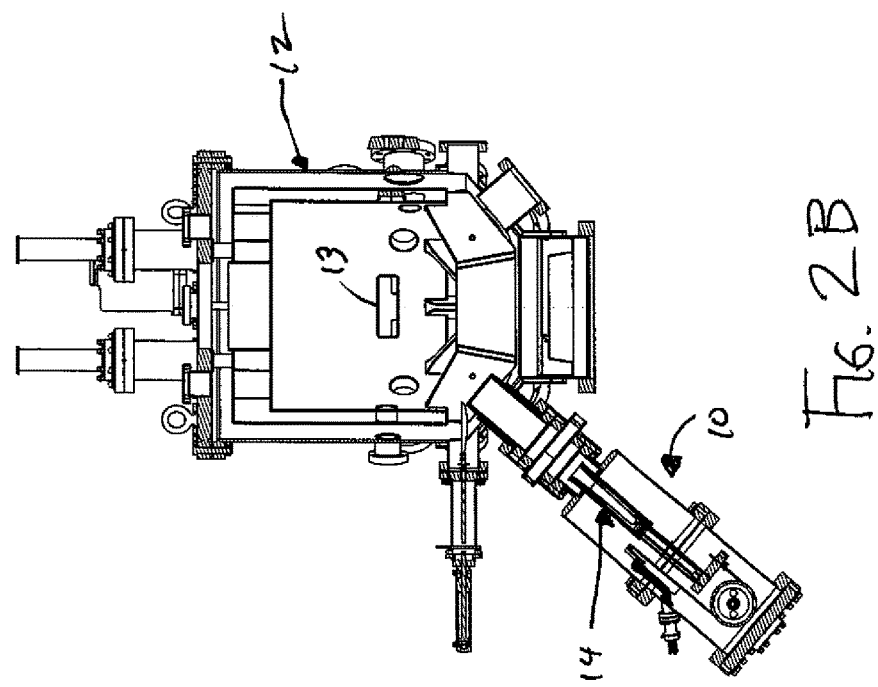
FIG. 2B is a cross-sectional view taken along line B-B of FIG. 2A.
Figure 2A:
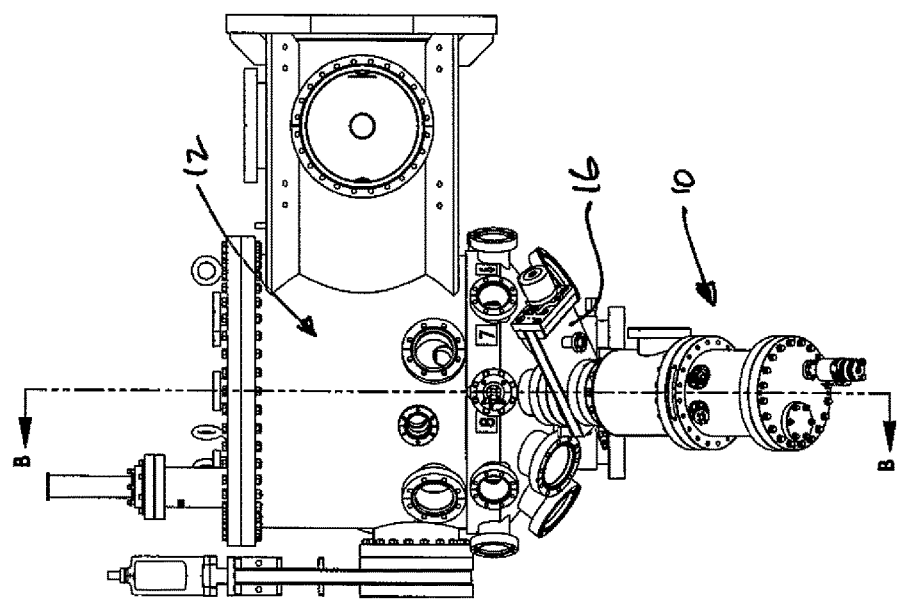
FIG. 2A is side view of a system of the present invention including an effusion growth module with a single retractable and extendible effusion source assembly of the present invention connected through a mounting port of the growth module and with the source retracted.

FIGS. 1A and 1B show a retractable source assembly 10 positioned and attached within a port of a growth module 12 in a downwardly hanging orientation and as directed to a target support 13 within the growth module 12. A source 14 is shown as extended to an operative position for effusion and partially positioned within an internal chamber of the growth module 12. An open gate valve 16 is also shown with the source 14 extended beyond it. Preferably, the end of the source 14 is at the end of the retractable source assembly 10 when fully extended. FIGS. 2A and 2B are similar to FIG. 1, but with the source 14 retracted fully to be positioned within the retractable source assembly 10 inside of the gate valve 16. With the source 14 retracted, the gate valve 16 can be closed to maintain the ultra-high vacuum within the growth module 12. Thereafter, the retractable source assembly 10 can be open, as described below, without venting the growth module 12. Such a gate valve 16 is commercially available, such as from VAT Inc. of Woburn, Mass. and as can be found at www.vatvalve.com, and preferably functions with a high temperature elastomer seal to be suitable for use. Such a gate valve 16 can be operatively controlled to open or close under the control of a manually rotated handle or with a pneumatic actuator, as examples.

FIGS. 3-6 illustrate the retractable source assembly 10 externally from different side and end views. The retractable source assembly 10 is preferably made of a number of separable components. In the illustrated embodiment, an enclosure is provided including a first housing 18 that is connected with a second housing 20, such as by conventional bolts connecting flange portions of the first and second housings 18 and 20. The enclosure creates an interior space defined by an interior surface. An open end of the first housing 18 is similarly connected with an end plate to close the first housing 18. The second housing 20 preferably includes an end wall 21 with an opening, wherein the end wall 21 is connected with the gate valve 16 with the opening of the end wall 21 open to the internal passage of the gate valve 16. The gate valve 16 is preferably connected on the other end of its internal passage to a cooling housing 24 that is provided to provide a cooling function to the source 14 when extended as described below. A power feedthrough 26 and a thermocouple feedthrough 28 are preferably provided to allow power wire and thermocouple wire access from external of the first housing 18 to an internal cavity thereof, as will be described in detail below. A vacuum pumping port 30 opening into the second housing 20 allows the internal space of all of the components of the retractable source assembly 10 to be pumped to a desired vacuum level. A rotary drive 32 is shown as mounted to the end plate 22, which rotary drive can comprise a manually rotated hermetic feedthrough as commercially available from Agilent Technologies, Inc. of Santa Clara, Calif. and as found at www.agilent or a conventional servo-type motor as are commercially available, provided that a hermetic seal is created with the end plate 22.

As shown in FIGS. 7 and 8, which are cross-sections taken along line C-C in FIG. 5, the source 14 is movable between retracted and extended positions, respectively. When extended, the end of the source 14 preferably is at or near the end of the cooling housing 24 so as to be positionable within a growth chamber as above. With the source 14 retracted, the gate valve 16 can be closed to seal the internal space of the cooling housing 24 from the internal space of the first and second housings 18 and 20. With the retractable source assembly 10 operatively connected with a growth module 12, the internal space of the cooling housing 24 can stay at ultra-high vacuum with the growth module 12 when the gate valve 16 is closed. The internal space of the first and second housings 18 and 20 can be accessed by separating the housings from one another, venting only the internal space of the first and second housings 18 and 20. Access to the source 14 is possible for replacement or refilling with source material for a next deposition process.

This system allows for isolation and removal of the source 14 without having to vent the growth module 12, reduces refill and maintenance times, minimizes maintenance interruptions, and eliminates the use of bellows for the retraction and insertion of the source 14. In addition, thermal control can be maintained with the provision of the cooling housing 24 as it surrounds a heated source 14, when extended and during a deposition process 24. Cooling water can be circulated within an interior channel of the cooling housing 24 for temperature control about the extended source and for gate valve 16 cooling. Also, this system can be retrofit in such a way that existing sources 14 can be utilized and do not have to be replaced.

As also shown in FIGS. 7 and 8, a source base plate 34 is provided to be movable along a guide rail 36 and as driven by the rotary drive 32. The rotary drive 32 includes a shaft portion 38 provided through the end plate 22 by way of a hermetic rotary motion feedthrough as are commercially available (not shown) that allows for rotational motion through the end plate 22. The shaft portion 38 is rotationally fixed with a lead screw 40 that is thus rotatable by the rotary drive 32 and that extends within the internal space of the first housing 18 preferably over at least its longitudinal length and beyond in order to provide for a movement stroke distance of the source base plate 34. The source base plate 34 is fixed with a travelling nut 42 that rides within the lead screw threads as well known for translation of the source base plate 34 within the interior space of the first and second housings 18 and 20.

Figure 9:
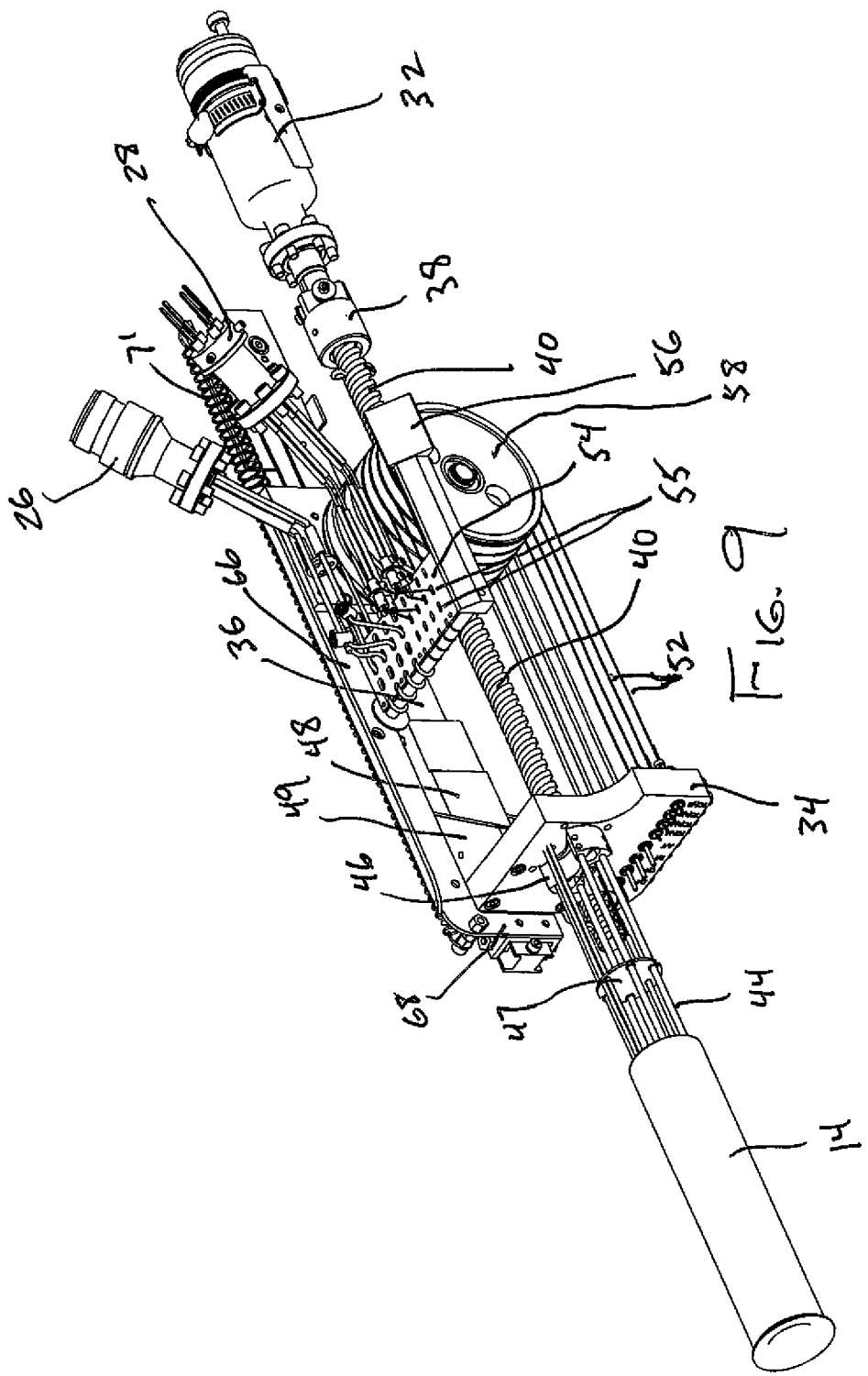
FIG. 9 is a perspective view of components of a retractable source assembly of the present invention but with housing components removed to illustrate multiple moving subsystems of the present invention and a first cable management system of the present invention.
Figure 13:
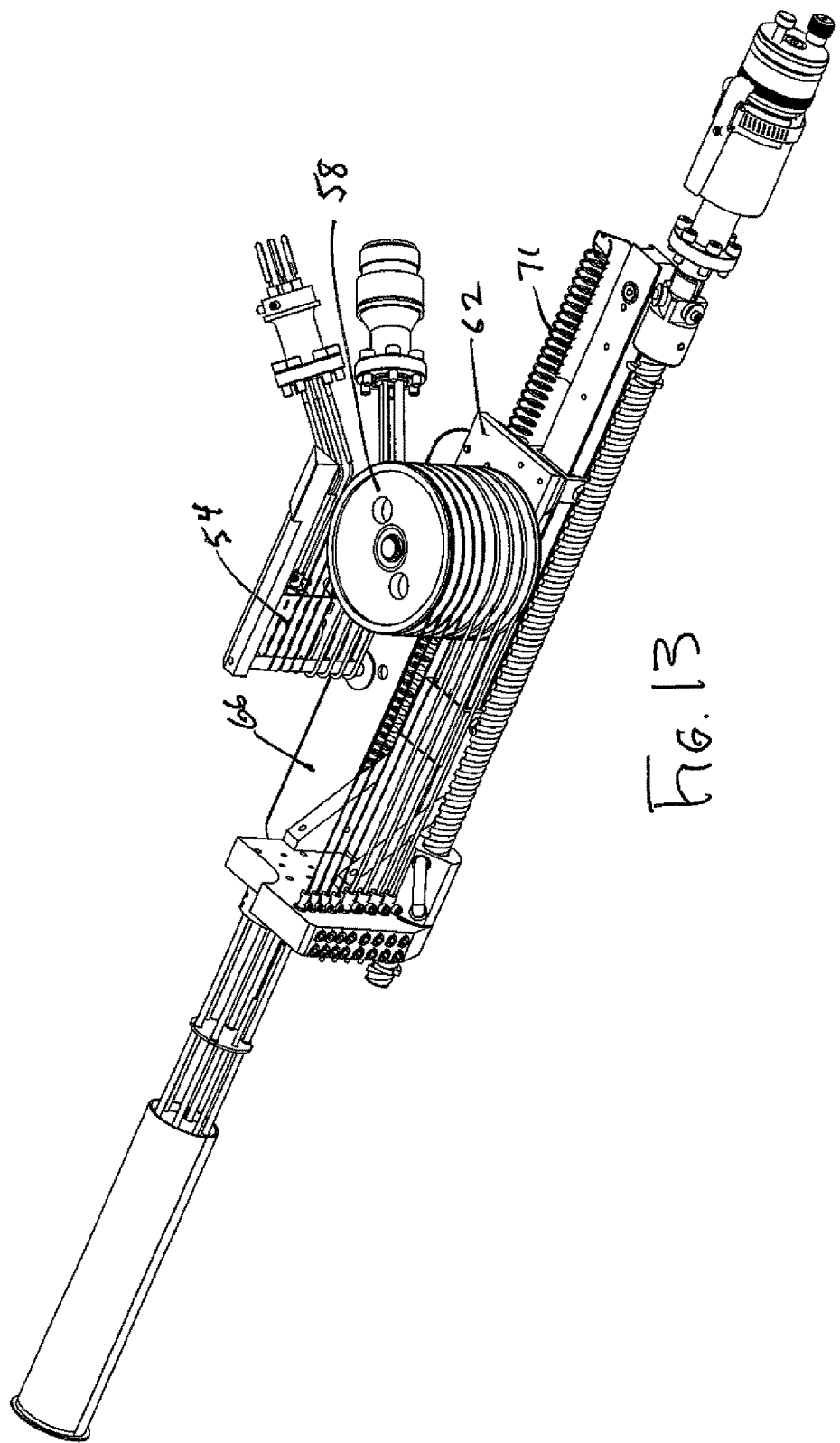
FIG. 13 is another perspective view of the assembly of FIG. 9 showing aspects of a lead screw drive mechanism of an embodiment of the present invention.

As shown in FIGS. 9 and 10, the source 14 is connected to move with the source base plate 34 by a plurality of rods 44 that are fixed with and extend from the source 14 to fit with openings of an adapter element 46 that is in turn fixed with the source base plate 34. Rods 44 are also preferably provided that extend directly into openings of the source base plate 34. Such an adapter element 46 allows for connection of the same source base plate 34 with different sources as have been developed. A spacer element 47 is also shown to align and space the rods 44 to one another.

Figure 16:
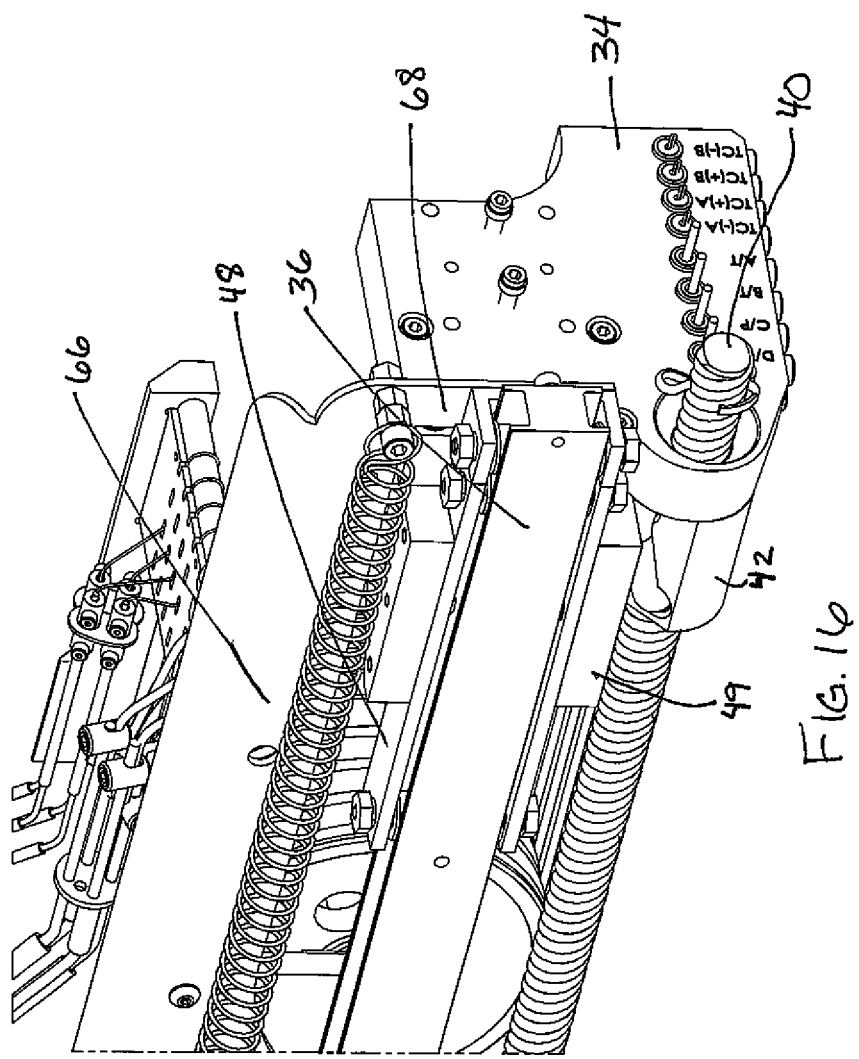
FIG. 16 is an enlarged perspective view of an end portion of the assembly of FIG. 9 showing a source base plate connected with a first carriage for movement along a guide rail as can be driven by a lead screw assembly of one embodiment of the present invention.

The source base plate 34 is also preferably fixed with a first carriage 48 that slides along the guide rail 36. As shown, the guide rail 36 can comprise an elongate element of a length sufficient to provide the desired source movement stroke length and can include guide features such as top and bottom channels 50 within which rollers or slide features of the first carriage 48 can move within and along the guide rail 36. The guide rail 36 is preferably fixed in position to at least the inside surface of the first housing 18 to extend in a longitudinal orientation. The guide rail 36 can be supported within the housings 18 and 20 in any desired manner. Structural support elements (not shown) can be utilized to fix the guide rail 36 in a fixed position relative to the housings 18 and/or 20. The first carriage 48 thus is slidable along the guide rail 36 over the stroke of movement of the source base plate 34 as driven by the rotary drive 32 and lead screw 40 interaction with the travelling nut 42. The first carriage 48 is illustrated best in FIGS. 12 and 16 as being connected with the source base plate 34 by gusset plates 49. As best shown in FIG. 16, the first carriage 48 can include rollers to follow with the channels 50 of the guide rail 36. As such, the travelling nut 42, the source base plate 34, the first carriage 48 with gusset plates 49 move together based upon rotation of the lead screw 40. With the source 14 connected to the source base 34 plate by rods 44, the source 14 also is controllably translated between extended and retracted positions based upon rotation of the lead screw 40.

Electrical wires or cables 52 can enter into the retractable source assembly 10 by way of the power feedthrough 26 and the thermocouple feedthrough 28. Such cables 52 are provided to provide power and functionality to the source 14, as well known. Thus, according to another aspect of the present invention, cable management from the feedthroughs to the source base plate 34 is desired. Wiring from the source base plate to the source 14 is also provided (but not shown) in a well know manner for connection with the source 14. As shown in FIG. 9 and elsewhere, the cables 52 are preferably run to the source base plate 34 so as to pass through openings of the source base plate 34, as may be facilitated by cable holding elements provided within such openings. Preferably, the cables 52 are thus fixed with the source base plate 34 to move with it. The cables 52 are also preferably fixed to the source base plate 34 in a linear manner to facilitate wire management described below.

The electrical cables 52 are also preferably fixed in position by a tension board 54, the purpose of which is to avoid any mechanical stress on the feedthroughs 26 and 28 and any pins or other components thereof. The tension board 54 (see FIG. 9, in particular) preferably includes plural aligned slots 55 for each cable so that the cables can be woven through the slots to provide fixation to each cable 52 with the tension board 54. The tension board 54 is preferably fixed to the interior surface of the first housing 18, but could otherwise be fixed in any desired position within the interior of either housing 18 or 20. A mount element 56 is shown fixed to and extended from the tension board 54 to be connected to a housing portion so that the tension board 54 and thus the portions of the cables 52 fixed in place to the tension board 54 are maintained is a specific desired location within the retractable source assembly 10. Specifically in the illustrated embodiment, the cables enter the inside of the housing 18 by way of the hermetic feedthroughs 26 and 28 and are each woven through plural slots of the tension board in an aligned manner. The cables 52 are preferably then are routed to pass along and over a leading edge of the tension board 54 and to pass under the tension board in a direction toward the end plate 22. Other routing configurations are contemplated, but it is preferred that the cables 52 be linearly aligned similarly to the alignment of the cable openings of the source base plate 34.

The electrical cables are provided with a length that is sufficient to extend between two contact locations, one contact location being at the movable source base plate 34 and the other contact location being at the tension board. Because the distance between the contact locations change as the source 14 is moved between extended and retracted positions, each cable 52 will necessarily have excess length or "slack" when the first contact location is moved closer to the second contact location, such as during a retraction operation. Each cable 52 is of a sufficient length so that the cables 52 allow for full extension of the source 14 as each cable is routed to the source base plate 34.

According to an aspect of the present invention, electrical cable management is desirable in order to keep the cables from becoming tangled or otherwise compromised at all times and in particular during extension or retraction of the source 14. While different approaches are described herein for winding the cables in certain configurations, it is understood that the cables can instead simply be "draped" or allowed to hang when slack is created between the ends of the cable; however, such an arrangement requires additional space for the cable slack to hang and is therefore more suitable for arrangements where sufficient space is available for the cables to hang between other components of the system without obstructing the performance of the system.

As shown in FIGS. 9-17, one embodiment of a cable management system can include a rotational pulley 58 with a plurality of circumferential grooves 60 that are also preferably in alignment with the linear arrangement of the cable contact locations to the source base plate 34 and to the tension board 54. To support the pulley 58 in an aligned position, the pulley 58 can be rotationally supported in a conventional manner to an axle 64 that is mounted to an axle support plate 62. The axle support plate 62 is preferably fixed with a second carriage 66 that also is provided to slide along the guide rail 36 in a similar manner as that described above with respect to the first carriage 48.

Figure 17:
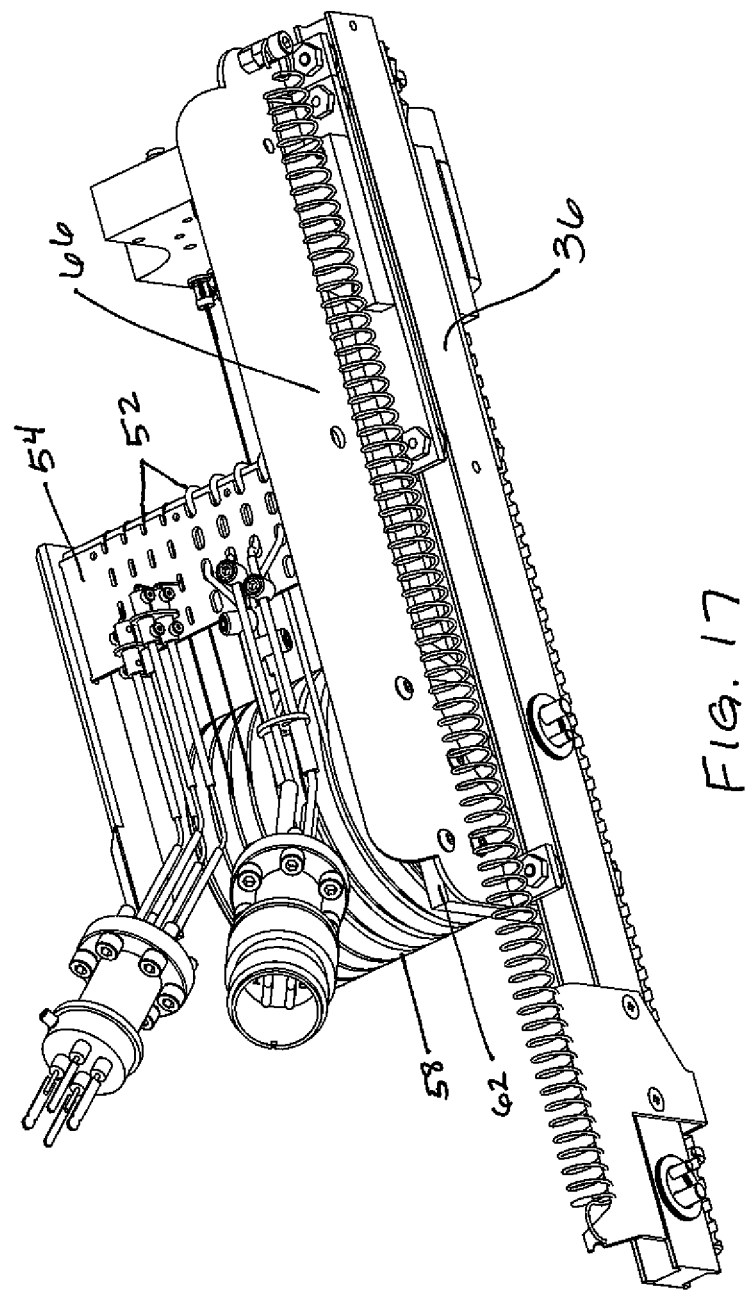
FIG. 17 is an enlarge perspective view of the assembly of FIG. 9 showing a cable management system of one embodiment of the present invention with cable routing through a tension board and about a movable pulley system.

The second carriage 66 is preferably an elongate element with first and second arm portions 68 and 70, the first arm portion 68 at a leading edge with a guide roller bracket and rollers to fit within and slide along the channels 50 of the guide rail 36, and the second arm portion 70 fixed with the axle support plate 62 on one side and provided with a guide roller bracket and rollers on the other side. The second carriage 66 thus being movable freely along the guide rail independently from the first carriage 48 and unconnected with any movement imparting means. The first arm portion 68, however, can limit travel of the second carriage 66 in a direction toward the end plate 22 by contact with a leading portion of the first carriage 48 as best shown in FIG. 17. The same is true of the possible abutment of the second arm 70 at the trailing end of the second carriage 66 with a trailing portion of the first carriage 48. The length of the elongate portion of the second carriage 66 is thus selected based upon the establishment of these limiting possibilities. Likewise, the length of the first carriage 48 can be varied in order to provide for any desired limits.

By this construction, the grooved pulley 58 with the cables 52 wrapped about the pulley 58, as shown, can travel along the guide rail 36 independently of the source base plate 34 with the cables 52 limiting the movement of the second carriage in the direction toward the end plate 22. This holds true even as the source based plate 34 is extended and retracted. During movements of the source base plate 34 and the first carriage 48, the second carriage 66 will also move along the guide rail, but the first and second carriages 48 and 66 will not move in tandem. The first and second carriages 48 and 66 will also move relative to one another based upon the amount of slack of the cables 52. This relative movement ensures that the cables 52 are maintained as aligned and with tension applied to each cable 52 to keep them in alignment so as not to tangle with one another or anything else.

Figure 14:
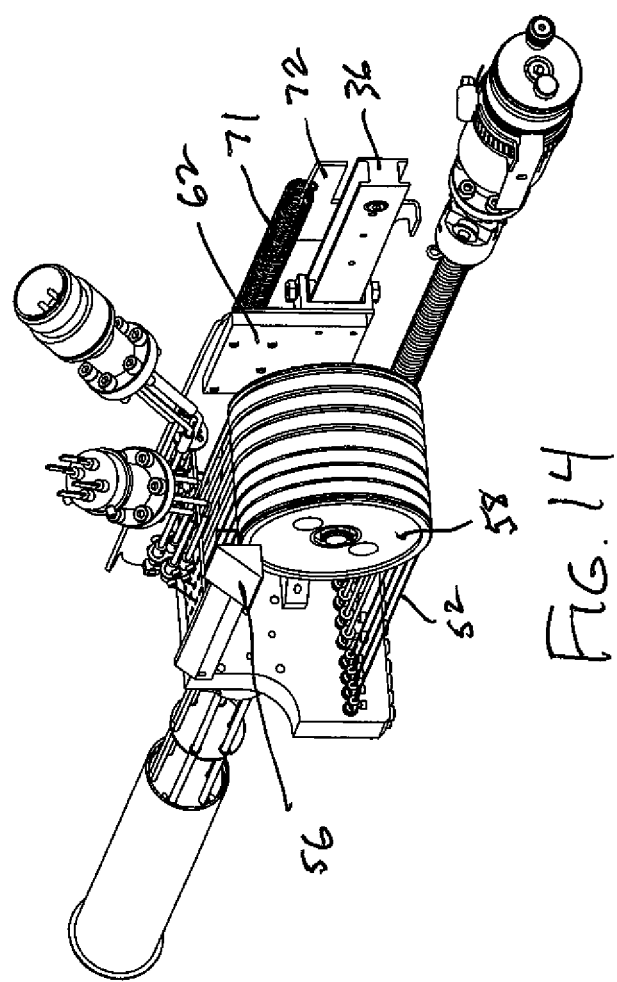
FIG. 14 is a perspective view similar to that of FIG. 13 but with the assembly rotated to show a cable guide aspect of the present invention.
Figure 15:
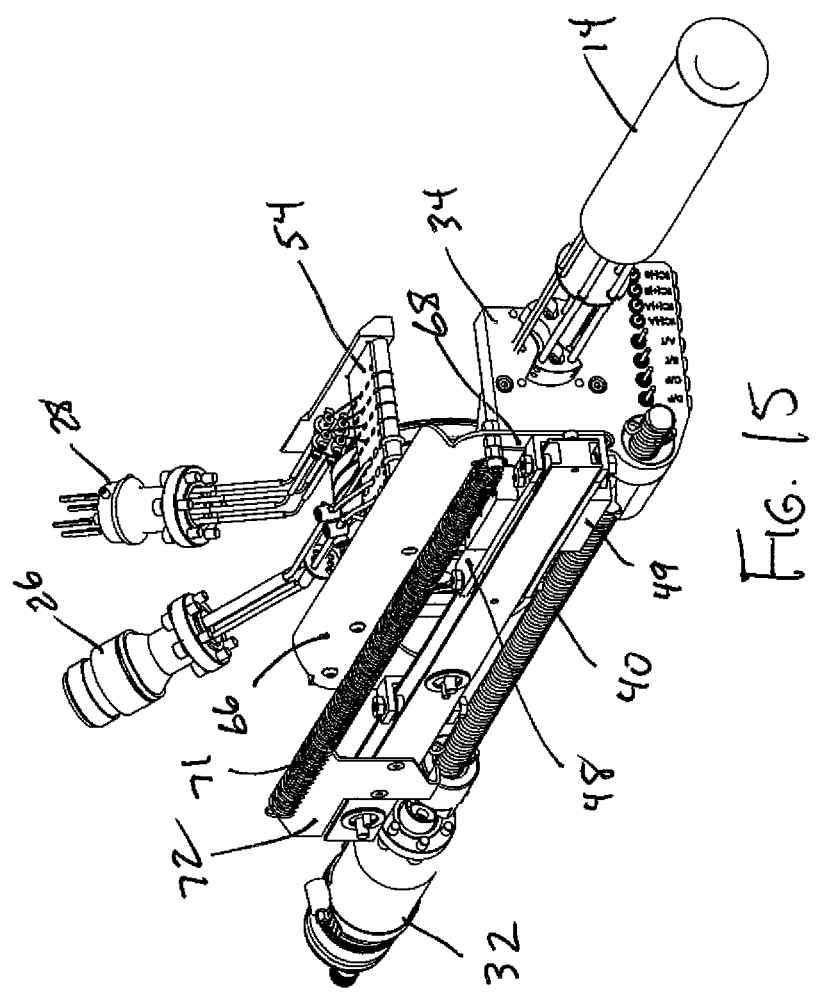
FIG. 15 is a reverse perspective view of that illustrated in FIG. 14.

In the situations where the retractable source assembly 10 is oriented as connected with a growth module 12 with the end plate 22 lower than the source 14, gravity will be an assisting factor in having the pulley 58 apply an amount of tension to the cables 52. It is further contemplated to provide a bias force to the pulley 58 to at least partially create tension within the cables 52. Specifically, a tension spring 71 is illustrated in FIGS. 14 and 15 as being connected between the leading or first arm portion 68 of the second carriage 66 and a bracket 72 that is fixed with a trailing portion of the guide rail 36 and thus the housings 18 and 20. Such a tension spring 71 applies a bias force urging the carriage in the direction toward the end plate 22 thus creating a tensile force within each of the cables 52 as routed over the pulley 58.

A method of removing a retractable source assembly 10 can preferable comprise a first step of retracting a source 14 within the retractable source assembly 10 beyond the gate valve 16. Then, the gate valve 16 can be shut to obtain a seal for the growth module environment. Subsequently, the retractable source assembly 10 can be vented. Venting can be done by simply turning off a pump (not shown) as operatively connected with the retractable source assembly 10 by way of the vacuum port 30 or by utilizing a vent valve (not shown) that can be provided at or near the vacuum port 30 for venting purposes. A step of backfilling the retractable source assembly 10 with dry gas such as nitrogen can be conducted. Then, the retractable source assembly 10 can be opened, such as by breaking the seal between the flanges of the splits first and second housings 18 and 20. Opening of the retractable source assembly 10 is preferred to be done between the housings 18 and 20 so that the whole internal assembly can be accessed as such is all preferably supported from and connected to the first housing 18. Removal of the second housing 20 can be done by a sliding motion of the housing 20 over the source 14 (and any sleeve 200 as discussed below) away from the housing 18 leaving the housing 18 with the guide rail 36 and carriages 48 and 66 and all movable components including the source base plate 34, lead screw 44, and the source 14 supported therefrom. Source replacement, refilling or other services can then be easily conducted. It is contemplated that the retractable source assembly 10 can otherwise be separated such as between the second housing 20 and the gate valve 16 or between the first housing 18 and the end plate 22 if other access is needed or if components within the retractable source assembly 10 are otherwise supported within the internal space of the housings 18 and 20.

Fixation of components of the present invention can be done is a variety of ways and combinations thereof. With metal components, welding may be used to provide a hermetic connection, bolts can be utilized with gaskets or sealants if desired, and any number of mounting brackets can be fabricated for fixation and positioning of components to one another.

Retractable source assemblies, like non-retractable sources, can be used to provide efficient deposition of copper, indium, and gallium, for example, for forming CIGS based photovoltaic devices such as those used in solar cells. In such application, one or more deposition sources are used with one or more selenium deposition sources in a vacuum deposition system for deposition of such CIGS based materials. Preferably, when deposition sources are used in a selenium environment materials used for construction of such deposition sources are selected accordingly. In particular, materials that are known to corrode when in the presence of selenium and high temperatures are preferably avoided when possible.

Deposition sources of the present invention are particularly useful in harsh vacuum environments such as those where corrosive materials such as selenium are used. It is contemplated, however, that deposition sources in accordance with the present invention can be used for deposition of any desired material in any desired vacuum environment including but not limited to metals, ceramics, semiconductors, and elemental materials, for example. Vacuum deposition sources in accordance with the present invention are also particularly useful in vacuum environments having a background pressure less than about 1 millitorr. Vacuum deposition sources in accordance with the present invention can also be used in vacuum environments having a background pressure in the high vacuum and ultrahigh vacuum regime such as those used in conventional thermal evaporation and molecular beam epitaxy, for example, including organic and inorganic materials. When deposition sources in accordance with the present invention are used in an environment free from corrosive materials such as selenium, materials used for construction of such deposition sources are preferably selected in view of a particular operating environment in which a deposition source is to be used. When appropriate, conventional materials for construction of vacuum equipment are preferably used such as stainless steel, refractory metals, graphite and pyrolytic boron nitride, for example.

Deposition sources in accordance with the present invention can be used for deposition on any desired substrates such as glass, semiconductor materials, and/or plastic materials, for example.

It is contemplated that the retractable source assembly of the present invention can be sized for different length sources as well. Housings can be designed of one or more weldment components or the like of different sizes to accommodate different size sources and to move such sources over different length strokes.

Figure 18:
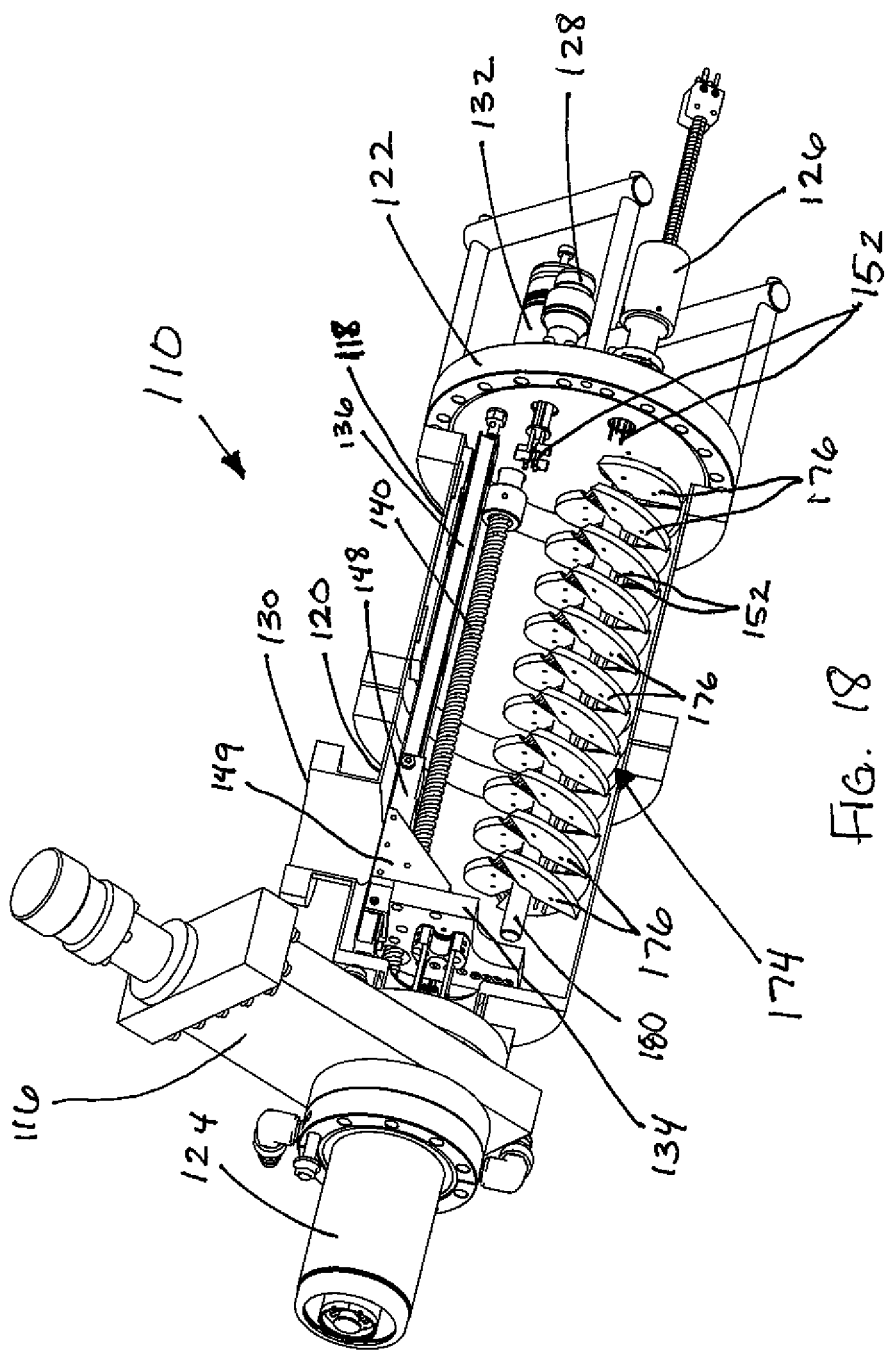
FIG. 18 is a perspective view partially in cross-section of another embodiment of a retractable source assembly of the present invention with an alternative cable management system and with a source thereof extended.
Figure 19:
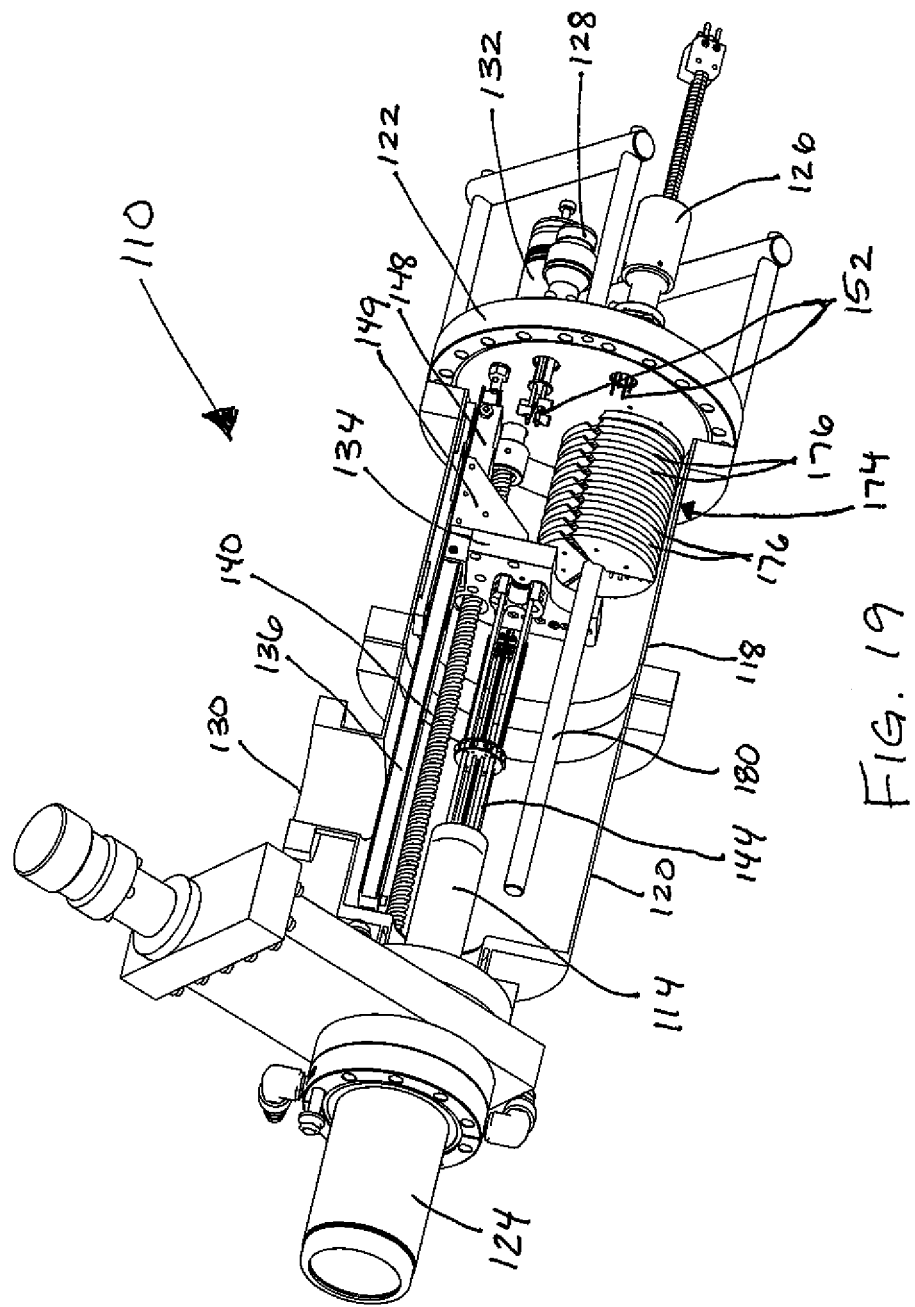
FIG. 19 is a view similar to FIG. 18, but with the source retracted.

FIGS. 18-22 illustrate an exemplary embodiment of a retractable source assembly 100 with a cable or wire management system that includes a cable "snake" configuration. The embodiment of FIGS. 18-22 includes many similar features and components as the embodiment of FIGS. 1-17 and such similar components are labeled similarly with a 1 in the hundredth position. A retractable source assembly 110 is illustrated connectible with a growth module 12 including a gate valve 116 and cooling housing 124 as described above. FIG. 18 shows the retractable source assembly 110 in an extended position, while FIG. 19 shows the retractable source assembly 110 in a retracted position. Like the retractable source assembly 110, described above, the retractable source assembly 110 preferably comprises a source base plate 134 that connects with a source 114 via rods 144, as above, and in also attached with a carriage 148 that is movable along a guide rail 136 positioned within housings 118 and 120 as above. A rotary drive 132 and lead screw 140 provide controlled movement to the source base plate 134, preferably also as above, to extend and retract the source 114.

In accordance with the embodiment illustrated in FIGS. 18-22, cables or wires are managed in a different way that also controls cable positioning during extension and retraction strokes within the housings 118 and 120. With this embodiment, no additional carriage is utilized and the cables are preferably entered within the interior of first housing 118 by way of a power feedthrough 126 and a thermocouple feedthrough 128 provided through the end plate 122 instead of a housing sidewall. A cable management system 174 advantageously expands and collapses, respectively, for source extension and retraction.

Power and thermocouple wires or cables 152 pass through and preferably are fixed in a first contact location at the feedthroughs 126 and 128. Like the embodiment described above, the cables 152 and also preferably fixed at a second contact location at the source base plate 134. Between the first and second contact locations a sufficient length of cable for each cable 152 is preferably provided so that a spiral of each cable can be created both when the source 114 is extended and retracted, as shown. This length of cable can be determined empirically or by well known modeling techniques.

An aspect of this embodiment of the present invention is the ability to controllably maintain the cables in such a spiral configuration during the extension and retraction of the source 114 and thus the expansion and collapse of the cable management system 174. To do this, spiral guides 176 have been developed along with a system to arrange the spiral guides 176 to permit controlled expansion and collapse based upon the movement of one cable contact location relative to another.

Each spiral guide 176 preferably is sized to accommodate a desired length of cable as such length would arc over about one hundred twenty degrees of a circle. Again this length can be determined empirically or by modeling based upon desired spiral dimensions. It is contemplated that each arc-like spiral guide 176 can be designed to extend for more or less than one hundred twenty degrees so that more or less than three spiral guides will be utilized for each full three hundred sixty degrees of a circle, it being preferably that a plurality of such spiral guides 176 be provided for each full spiral rotation to provide sufficient flexibility to the cable arrangement.

Figure 21:
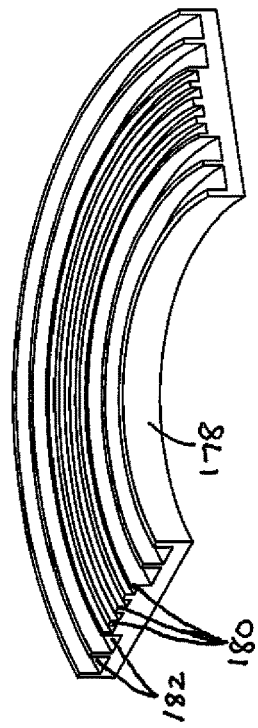
FIG. 21 is a perspective view of the spiral guide of FIG. 20.
Figure 20:
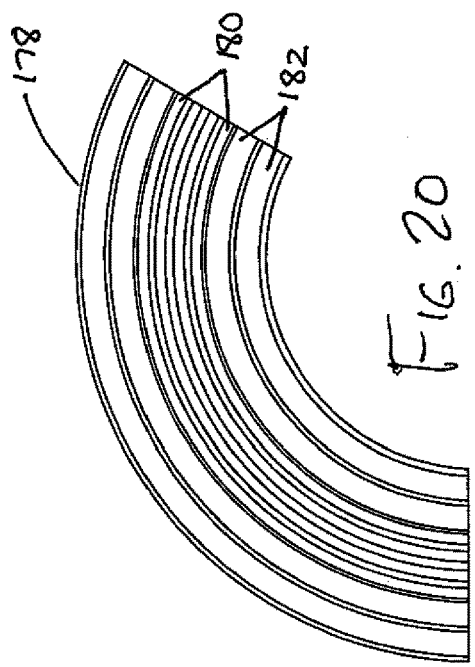
FIG. 20 is a top view of a spiral guide of the present invention as usable within the assembly of FIGS. 18 and 19.
Figure 22:
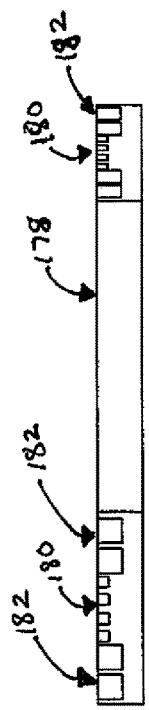
FIG. 22 is a side view of the spiral guide of FIGS. 20 and 21.
Figure 27:
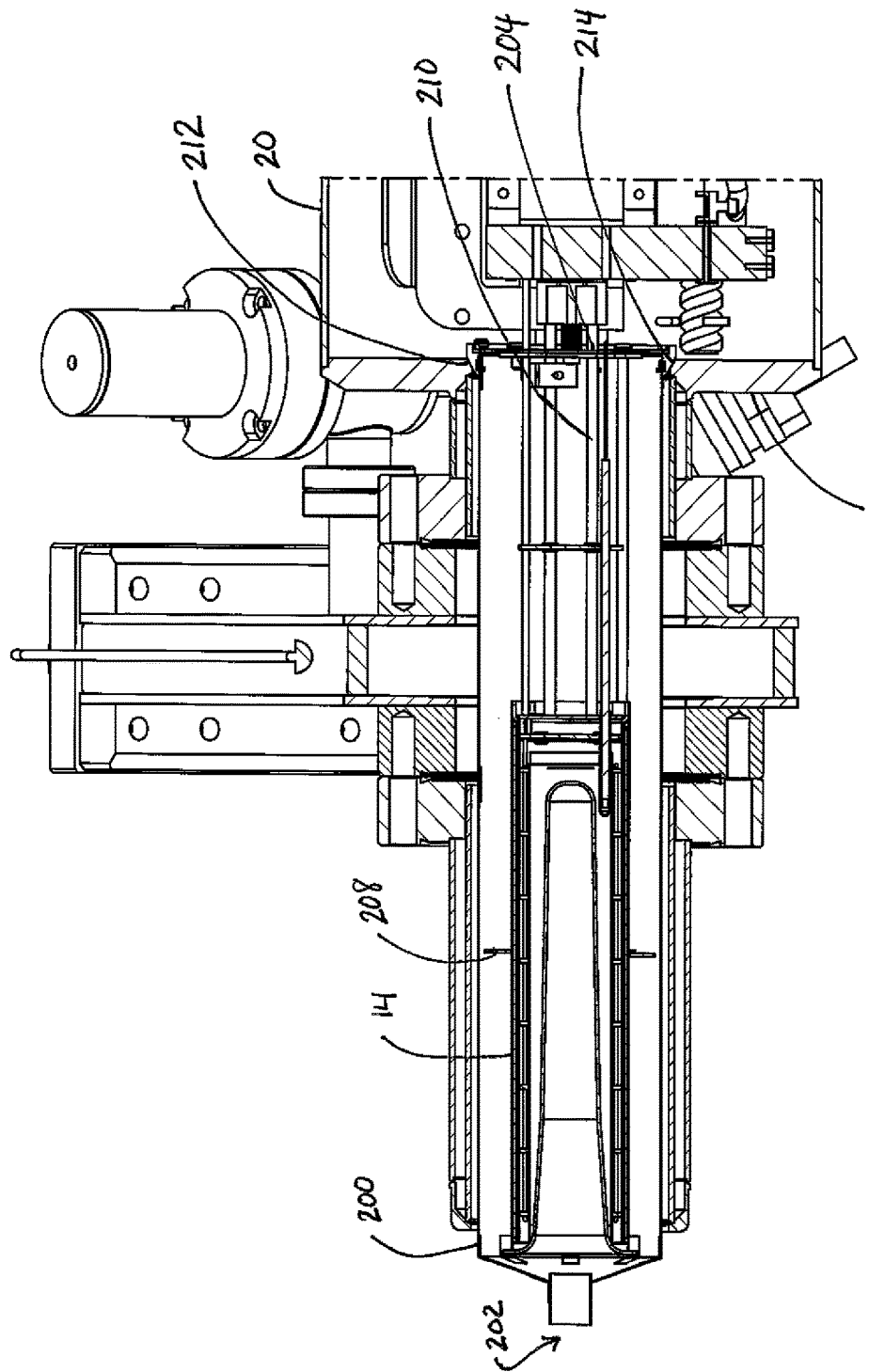
FIG. 27 is a longitudinal cross-sectional view of an extended source and differential pumping sleeve as positioned within a cooling housing and gate valve and as extended through an opening of the enclosure housing with tapered surfaces of the opening and sleeve end portion creating an effective seal.

As shown in FIGS. 20-22, each spiral guide 176 is preferably comprises of two side segments 178 that are connected together. Preferably, each side segment 178 can accommodate the number of cables to be managed, which for the illustrated embodiment can include four power cables and four larger thermocouple cables with grooves 180 and 182, respectively. The side segments 178 and thus the assembled spiral guides 176 are preferably comprised of a ceramic material that can withstand temperatures of the source environment. Other suitable materials are contemplated provided such material can withstand the source environment and operating temperatures.

The system of spiral guides 176 is created by sandwiching the plural cables 152 between the side segments 178 and securing the side segments 178 together, such as by mechanical fastening with screws or the like, or by any other manner provided operating temperatures are suitable for the type of adhesion, bonding or other connection technique. The spiral guides are preferably positioned adjacent to one another to create a spiral with a small amount of play between spiral guide edges for added flexibility as can also be determined empirically as such spirals are created. Preferably, the assembly will allow expansion without binding of the cables and will also allow collapse with the spiral guides lying substantially flatly with respect to one another as shown in FIG. 19. In the case of three spiral guides 176 for each spiral rotation, as shown, three such spiral guides will lie substantially in a flat position to one another to create a stack of circles. A guide post 180 is also preferably provide to extend from the wall of the end plate 122 sufficiently to provide an effective guide for the spiral guides as assembled in series to create the wire management system 174. Preferably the entire wire spiral from end to end follows along and is guided or facilitated by the guide post 180.

Methods of removal of the retractable source assembly 110 and subsequent source replacement, refilling or other servicing of the retractable source assembly 110 are the same as that discussed above with respect to the retractable source assembly 10.

FIGS. 23-26 provide various views of a differential pumping sleeve assembly of the invention, including a number of features. Such systems limit process gas flow from the growth module into the retractable source assembly 10, 110, to the source crucible, and to the source material within the crucible. Process gas flow means molecular gas flow within a high vacuum environment. This enables high differential pumping speed and high conductance to the source head and the ability to place the source at the same working distance as a standard source. The pumping sleeve and how it mates to the housing 20 and source 14, 114 isolate the two process environments, one environment being within the growth module 12 and the other environment being within the retractable source assembly 10, 110.

A direct-coupled turbo pump (not shown) can provide a desired pumping speed and conductance to effectively differentially pump the interior of the retractable source assembly 10, 110 to a lower pressure than the pressure within the growth module 12. Pumping can be done through the vacuum port 30, 130 during operation of an effusion process to maintain the interior of the retractable source assembly 10, 110 including the space around the source 11, 114 and thus the material within its crucible at a lower pressure than the vacuum pressure within the growth environment 12. This lower pressure within the retractable source assembly 10, 110 environment minimizes the flow of process gas from the growth module 12 into the retractable source assembly 10, 110. However, to make this effective, a differential pumping sleeve 200 is preferably operatively mounted to move with the source base plate 34, 134 to create a partial environment around the source 14, 114 that can be effectively pumped by pumping of the interior of the retractable source assembly 10, 110, as above. The sleeve 200 preferably sufficiently limits gas flow from the growth environment into the environment within the retractable source assembly 10, 110 so that such a lower pressure can be created within the retractable source assembly 10, 110. Advantageously, by making such a differential pumping sleeve 200 movable with a source 14, 114 in accordance with the present invention, the sleeve 200 can also be removed from the growth module 12 by retraction of the source 14, 114 for inspection, cleaning, replacement or otherwise. Moreover, sleeves 200 can be interchanged with one another based upon the size of the effusion target, wherein different sleeves may have different size end openings 202 based upon the target substrate size within the growth module 12. Smaller end openings 202 are preferred as they allow better pressure differential between the growth module and the retractable source assembly 10, 110 and thus better minimize process gas flow to the retractable source assembly 10, 110.

A preferred differential pumping sleeve 200 is shown in FIGS. 23-27 including features of its support and connection with the retractable source assembly 10 of the FIGS. 1-17 embodiment of the present invention so that the sleeve 200 can be extended and retracted with the source 14. Sleeve 200 can also be utilized similarly with the retractable source assembly 110 of the present invention or any other retractable source of the present invention. The sleeve may be made of stainless steel, tantalum, or other suitable high temperature materials, as examples.

The illustrated sleeve 200 basically comprises a tube that is open at one end and has a reduced end opening 202 at the other end, wherein the sleeve 200 slides over and covers the source 14. The sleeve 200 is preferably supported to the source base plate 34 to move with it. Preferably a bayonet-type connection is provided between the source base plate 34 and the sleeve by way of a lock plate 204 that is supported to the source base plate, preferably at a spaced distance beyond the surface of the source base plate 34. The lock plate 204 can be supported by standoff elements or the like, and more preferably are supported by at least a pair of compression springs 206 that provide a bias force between the facing surfaces of the source base plate 34 (which can be by way of the adapter 46) and the lock plate 204 tending to urge them apart from one another. Compression springs 206 may be maintained in position by posts or guide elements (not shown) from one or both of the adapter 46 of the source base plate 34 and the lock plate 204. Rods 44 that support the source 14 from the adapter 46 of the source base plate 34 preferably either pass alongside or through openings of the lock plate 204 so as not to interfere with movement of the lock plate 204 as permitted to a limited degree by the compressability of the compression springs 206. The compression springs 206 can also be maintained in position between the lock plate 204 and the source base plate 34 by being positioned surrounding portions of posts 44 within such space.

The sleeve 200 preferably connects with the lock plate 204 by a partial turn lock system (e.g., ⅛), wherein elements adjacent the open edges of the sleeve 200 engage with and lock with complimentary elements of the lock plate 204 during a partial turn (i.e. a bayonet connection). FIGS. 23 and 24 illustrate the action of sliding a sleeve 200 over the length of the supported source 14 and the attaching of the sleeve 200 to the lock plate 204 by a partial turn of the sleeve 200 to lock the sleeve in a supported place. Removal of the sleeve 200 is accomplished by a reverse turning of the sleeve 200 relative to the lock plate 204 and then sliding the sleeve back from the source 14.

FIG. 25 further illustrates an options circular standoff 208 that is supported at a significantly spaced distance from the lock plate 204 by a pair of standoff rods 210. This standoff 208 facilitates guiding the sleeve 200 over the source 14 and the standoff rods 210 are fixed with the lock plate 204 to extend therefrom to space the circular standoff 208 at a desired distance from the lock plate 204.

The sleeve 200 preferably also includes a tapered end surface 212 to create an effective seal with the end wall 21 of the housing 20 when the source 14 and sleeve 200 are extended. As shown in FIG. 26, a tapered surface 214 is also preferably provided about the periphery of the opening through the end wall 21 to engage with the tapered end surface 212 of the sleeve 200 when the source 14 and sleeve 200 are extended fully. The compression springs 206 allow for a limited amount of variation of the extended position of the sleeve 200 and provide a bias force urging the sleeve's taper surface 212 into engagement with the end wall's tapered surface 214 to create an efficient seal between the two. Such an effective seal allows for differential pumping to me successful and maintained, as discussed above.

Vacuum deposition apparatuses, sources, and nozzles in accordance with the present invention may include any desired fluid cooling arrangement. Such fluid cooling may use any desired cooling fluid such as air, nitrogen, and water, for example.

Vacuum deposition apparatuses, sources, and nozzles in accordance with the present invention may also include heat shielding. Preferably, heat shielding comprises plural layers of refractory metal material. For example, plural layers of tungsten, tantalum, molybdenum, niobium and other heat resistant materials can be used. One or more of layers can be knurled if desired. Heat shielding may be provided as plural segments in order to allow for thermal expansion. Such heat shielding is optional and not required.

Vacuum deposition apparatuses and nozzles in accordance with the present invention can be used with deposition sources used for co-deposition of copper, indium, and gallium. That is, apparatuses in accordance with the present invention can be used to provide selenium deposition material together with deposition sources suitable for providing copper, indium, and gallium. For example, apparatuses and methods for co-deposition of copper, indium, and gallium are described in Applicant's co-pending patent application Ser. No. 12/628,189 entitled "LINEAR DEPOSITION SOURCE," filed on Nov. 30, 2009, the entire disclosure of which is incorporated by reference herein for all purposes.

The present invention has now been described with reference to several exemplary embodiments thereof. The entire disclosure of any patent or patent application identified herein is hereby incorporated by reference for all purposes. The foregoing disclosure has been provided for clarity of understanding by those skilled in the art of vacuum deposition. No unnecessary limitations should be taken from the foregoing disclosure. It will be apparent to those skilled in the art that changes can be made in the exemplary embodiments described herein without departing from the scope of the present invention. Thus, the scope of the present invention should not be limited to the exemplary structures and methods described herein, but only by the structures and methods described and the equivalents of those claimed structures and methods.

What is claimed is:

1. A retractable source assembly for moving a source base plate from a first position to a second position, the retractable source assembly comprising:
   an enclosure having an inside surface;
   a rail attached to the inside surface of the enclosure;
   a first carriage positioned on the rail and movable along the rail between the first and second positions as driven by a driving device, the first carriage comprising the source base plate; the first carriage comprising a first contact;
   a second contact provided on a board element that is fixed relative to the enclosure and that can be electrically connected to a cable feedthrough of the enclosure;
   an electrical cable connected to the first contact at a first end and connected to the second contact at a second end of the electrical cable, wherein the first and second ends are spaced at a first distance from each other when the source base plate is in the first position, wherein the first and second ends are spaced at a second distance from each other when the source base plate is in the second position, and wherein the first distance is greater than the second distance; and
   a pulley rotatably attached to a second carriage that is independently slidable from the first carriage along the rail, the pulley positioned so the electrical cable at least partially wraps around the pulley by allowing and limiting movement of the second carriage as the first carriage moves between the first position and the second position.

2. The retractable source assembly according to claim 1, wherein the enclosure comprises a first and a second housing separably connected together.

3. The retractable source assembly according to claim 2, wherein the rail extends substantially along a length of the first and second housings.

4. The retractable source assembly according to claim 1, wherein the enclosure comprises a gate valve.

5. The retractable source assembly according to claim 1, wherein the driving device comprises a lead screw mechanism.

6. The retractable source assembly according to claim 5, wherein the lead screw mechanism is driven by a rotary motion feedthrough.

7. The retractable source assembly according to claim 1, further comprising a plurality of first contacts.

8. The retractable source assembly according to claim 1, further comprising a plurality of second contacts.

9. The retractable source assembly according to claim 1, further comprising a plurality of electrical cables.

10. The retractable source assembly according to claim 1, wherein the pulley comprises grooves.

11. The retractable source assembly of claim 1, further comprising a differential pumping sleeve attached to move with the source base plate.

12. The retractable source assembly of claim 11, wherein the sleeve is mounted to the source base plate by a plurality of compression springs.

13. The retractable source assembly of claim 12, wherein the sleeve includes a tapered end portion that engages with a tapered portion of an opening of the enclosure.

* * * * *